(12) United States Patent
Kim et al.

(10) Patent No.: US 9,917,063 B2
(45) Date of Patent: Mar. 13, 2018

(54) SEMICONDUCTOR PACKAGE STRUCTURE FOR IMPROVING DIE WARPAGE AND MANUFACTURING METHOD THEREOF

(71) Applicant: Amkor Technology, Inc., Chandler, AZ (US)

(72) Inventors: Jin Seong Kim, Gyeonggi-do (KR); Byong Woo Cho, Seoul (KR); Cha Gyu Song, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 18 days.

(21) Appl. No.: 14/447,415

(22) Filed: Jul. 30, 2014

(65) Prior Publication Data

US 2015/0035141 A1    Feb. 5, 2015

(30) Foreign Application Priority Data

Jul. 31, 2013    (KR) .................. 10-2013-0090900

(51) Int. Cl.
*H01L 23/00*    (2006.01)
*H01L 23/31*    (2006.01)

(52) U.S. Cl.
CPC ........ *H01L 23/562* (2013.01); *H01L 23/3128* (2013.01); *H01L 24/13* (2013.01); *H01L 24/16* (2013.01); *H01L 24/81* (2013.01); *H01L 2224/131* (2013.01); *H01L 2224/16227* (2013.01); *H01L 2224/81801* (2013.01); *H01L 2924/014* (2013.01); *H01L 2924/15331* (2013.01); *H01L 2924/1815* (2013.01); *H01L 2924/18161* (2013.01); *H01L 2924/2064* (2013.01); *H01L 2924/20641* (2013.01); *H01L 2924/3511* (2013.01); *H01L 2924/3512* (2013.01)

(58) Field of Classification Search
USPC ....... 257/528, 737, 734, 738, 690, 531, 678, 257/676, 675, 773, 774, 777, 782
See application file for complete search history.

(56) References Cited

U.S. PATENT DOCUMENTS

2007/0098995 A1*  5/2007  Masuko et al. ............... 428/413
2008/0157300 A1*  7/2008  Chuang ............... H01L 23/3121
                                                         257/675
2009/0321912 A1*  12/2009  Watanabe et al. ............ 257/686
(Continued)

FOREIGN PATENT DOCUMENTS

KR           100865125 B1    10/2008
KR         1020110074469 A    6/2011
KR         10-2013-0009654    1/2013

*Primary Examiner* — Moin Rahman
(74) *Attorney, Agent, or Firm* — McAndrews, Held & Malloy, Ltd.

(57) ABSTRACT

A semiconductor die package includes a semiconductor die, a film for improving die warpage bonded to a first face of the semiconductor die, a plurality of electrically conductive bumps formed on a second face of the semiconductor die, a substrate onto which the electrically conductive bumps of the second face of the semiconductor die are bonded to electrically connect the semiconductor die and the substrate, and a mold compound applied these components to form an exposed surface of the semiconductor die package that is coplanar with an exposed surface of the film.

16 Claims, 3 Drawing Sheets

(56) References Cited

U.S. PATENT DOCUMENTS

| | | | |
|---|---|---|---|
| 2010/0117226 A1* | 5/2010 | Yang | H01L 21/561 257/737 |
| 2010/0127382 A1* | 5/2010 | Akahoshi et al. | 257/692 |
| 2010/0243159 A1* | 9/2010 | Nishio | B29C 53/32 156/712 |
| 2011/0024180 A1* | 2/2011 | Ko | H05K 3/4007 174/263 |
| 2012/0001328 A1* | 1/2012 | Chang | H01L 23/3128 257/738 |
| 2013/0154108 A1* | 6/2013 | Lin | H01L 23/5389 257/774 |
| 2013/0249104 A1* | 9/2013 | Chi | H01L 21/561 257/774 |
| 2014/0367848 A1* | 12/2014 | Chi et al. | 257/737 |

* cited by examiner

SEMICONDUCTOR PACKAGE STRUCTURE FOR IMPROVING DIE WARPAGE AND MANUFACTURING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2013-0090900, filed on Jul. 31, 2013, the contents of which are hereby incorporated herein by reference, in their entirety.

FIELD

The present disclosure relates to a method of manufacturing a semiconductor package, and in particular, to a semiconductor package structure for improving die warpage and a manufacturing method thereof. In manufacturing a package for a semiconductor die, after a film for improving warpage is bonded on one side of the semiconductor die, the semiconductor die with the film bonded thereon may then be attached to a substrate, and packaging completed. Stresses caused by differences in the coefficients of thermal expansion of the semiconductor die, the substrate, and surrounding packaging materials may be reduced by means of the film for improving die warpage, thereby improving warpage of the semiconductor die due to thermal expansion.

BACKGROUND

In recent years, electronics have been subject to a gradual trend of downsizing and thinning. Accordingly, new semiconductor packages suitable for use in the manufacture of downsized and thinned electronic devices have come into the market. To accomplish this, a variety of manufacturing processes are continuously being developed for new semiconductor packages, and the thickness of semiconductor chips are continuously being reduced.

A typical manufacturing process of a semiconductor package includes steps of bonding of a semiconductor die to a basic frame such as, for example, a lead frame or a printed circuit board (PCB), electrically connecting the semiconductor die and the basic frame to each other by means of a wire bonding or bumping technology, and molding the assembly within a protective resin.

As the thickness of the semiconductor die to be packaged decreases, there is an increasing problem of warpage in the semiconductor die due to thermal expansion that may occur, for example, after bonding of the semiconductor die onto the basic frame, or after bonding the semiconductor die onto the substrate.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

A semiconductor die package structure for improving die warpage and a manufacturing method thereof, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

Figure 1:
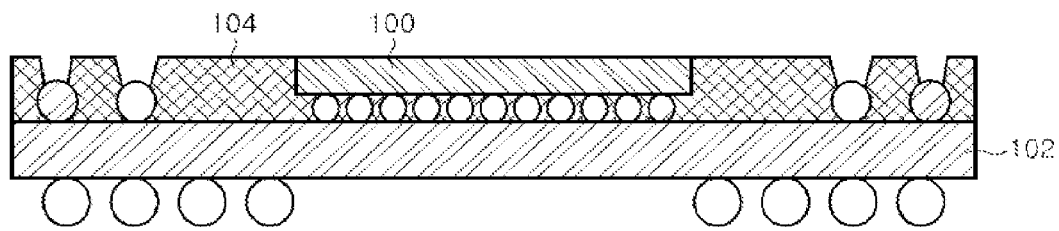
FIG. 1 is a cross-sectional view of a structure of a semiconductor die package.

Aspects of the present disclosure relate to a semiconductor die package and a manufacturing method thereof. More specifically, representative embodiments of the present disclosure relate to a semiconductor die package and a method of manufacturing such a semiconductor die package, in which a film is bonded to a surface of the semiconductor die to reduce the effects of differences in the coefficients of thermal expansion of the components of the semiconductor die package, thereby reducing warpage of the semiconductor die.

Various aspects of the present disclosure will be described in more detail with reference to the accompanying drawings. Those skilled in the art will easily realize various aspects of the present disclosure upon reading the present patent application.

It should be noted that the thickness or size of each the illustrated elements may be exaggerated for clarity in the accompanying drawings, and that like reference numerals may refer to like elements. Additionally, the term "semiconductor die" in this specification includes, for example, a semiconductor chip having an active circuit and/or a passive circuit, a semiconductor wafer, or equivalents thereof.

As utilized herein, the term "exemplary" means serving as a non-limiting example, instance, or illustration. Also, as utilized herein, the term "representative" means serving as a non-limiting example, instance, or illustration.

Hereinafter, examples of embodiments of the present disclosure will be described in detail with reference to the accompanying drawings such that they can easily be made and used by those skilled in the art. Like numbers may refer to like elements throughout. In addition, when it is said that an element is electrically coupled to another element, it will be understood that these elements may be directly coupled to each other and may be coupled to each other with another element interposed therebetween.

Hereinafter, the embodiments of the present disclosure will be described in detail with reference to the accompanying drawings. In the following description, well-known functions or constitutions will not be described in detail if they would obscure the subject matter of the present disclosure in unnecessary detail. Further, the terminologies to be described below are defined in consideration of functions in the present disclosure and may vary depending on intentions or practices of a user or an operator. Accordingly, the definition may be made on a basis of the content throughout the specification.

FIG. 1 is a view of a structure of a semiconductor die package.

As shown in FIG. 1, packaging of a semiconductor die may be completed by bonding a semiconductor die 100, which may be manufactured to be very thin, onto a substrate 102 that may be, for example, a printed circuit board (PCB) substrate, and then filling the region around and under the semiconductor die 100 using a mold compound 104, to form the completed package.

In cases where the semiconductor die package may be subject to thermal expansion due to heat being applied to, or generated within the semiconductor die package, differences in the coefficients of thermal expansion of the substrate 102, the mold compound 104, and the semiconductor die 100 may cause problems resulting in warpage of the semiconductor die 100.

Accordingly, it is important for the materials of the substrate 102 and the mold compound 104 to be selected so as not to cause die warpage due to differences in the coefficients of thermal expansion of these components and the semiconductor die 100. However, because the coefficient of thermal expansion of the semiconductor die 100 itself is difficult to adjust, previous efforts to improve the phenomenon of die warpage caused by the thermal expansion have focused primarily on adjusting the materials of the substrate 102 and the mold compound 104 components of the semiconductor die package.

FIGS. 2A through 2D are cross-sectional views illustrating a process of forming a semiconductor die package structure for improving die warpage, in accordance with an embodiment of the present disclosure. A structure of a semiconductor die package of the present disclosure will be described in detail with reference to FIGS. 2A through 2D, as follows.

Figure 2A:
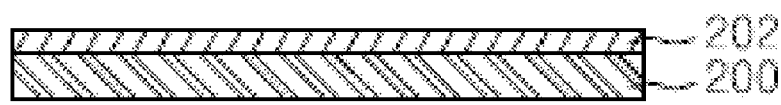
FIG. 2A through FIG. 2D are cross-sectional views illustrating a process of forming a semiconductor package for improving warpage of a semiconductor die, in accordance with an embodiment of the present disclosure.

FIG. 2A is an illustration of an initial step in a process of forming a semiconductor die package, in accordance with the present disclosure. FIG. 2A includes a film 202 for improving warpage of a semiconductor die, and a semiconductor die 200. As shown in FIG. 2A, the film 202 may be bonded onto a first face of the semiconductor die 200 that may, for example, be the back side or inactive surface of the semiconductor die 200. A second face of the semiconductor die 200, which is shown opposite the first face, may contain active or passive circuit elements. The second face of the semiconductor die 200 may then be available to be bonded onto a surface of a substrate such as, for example, the substrate 206 shown in FIG. 2D, which may be, for example, a PCB substrate.

In accordance with a representative embodiment of the present disclosure, a film for improving warpage of the semiconductor die 200, such as the film 202 of the example of FIG. 2A, may be formed with a thickness in a range of 10 μm to 100 μm. In accordance with the present disclosure, the thickness of the film 202 may be adjusted to accommodate differences in thickness of the semiconductor die 200 that is being packaged as part of a semiconductor die package. For example, the thickness of a mold compound that surrounds a semiconductor die such as, for example, the mold compound 104 of FIG. 1 that surrounds the semiconductor die 100, may be fixed. This may result from the use of a single mold cavity geometry for the packaging of a number of different semiconductor die designs. The geometry of a mold cavity may determine the various dimensions (e.g., thickness) of mold compound used in packaging a semiconductor die. In a representative embodiment of the present disclosure, the semiconductor die packaged in such a mold cavity may have different die thicknesses due, for example, to different die designs, or changes in die fabrication techniques or materials. In accordance with the present disclosure, if the thickness of a first semiconductor die to be packaged is greater than that of a second semiconductor die to be packaged, then the thickness of the film to be bonded to first semiconductor die may be adjusted to be correspondingly less than the thickness of the film to be bonded to the second semiconductor die. That is, in a case in which the thickness of a mold compound is fixed by the mold cavity at 150 μm, and thickness of the semiconductor die 200 to be packaged is 100 μm, a suitable corresponding thickness of the film 202 to be bonded to the semiconductor die 200 may be 50 μm, so that the total thickness of the film 202 and the semiconductor die 200 is maintained at the 150 μm dimension of the thickness of the mold compound. In a representative embodiment of the present disclosure, the characteristics of the film 202 may be chosen based upon the thickness of semiconductor die 200, and the thickness of film needed to maintain the desired semiconductor die package geometry. In accordance with the present disclosure, as the thickness of the semiconductor die 200 is reduced, the thickness of the film 202 bonded to the semiconductor die 200 may be increased a corresponding amount, to achieve the desired improvement in warpage of the semiconductor die 200.

In the manner described above, the differences in the coefficients of thermal expansion of the semiconductor die 200, a surrounding mold material, and a substrate, may effectively be accommodated during the course of manufacturing a semiconductor die package by bonding a film such as the film 202 of FIG. 2A on a face of the semiconductor die 200, thereby counteracting a phenomenon of warpage of the semiconductor die 200.

In accordance with the present disclosure, the phenomenon of warpage of a semiconductor die such as, for example, the semiconductor die 200 of FIG. 2A, due to differences in the coefficients of thermal expansion of components of a semiconductor die package, may be improved by appropriately selecting a film such as, for example, the film 202 of FIG. 2A to be bonded onto a face of the semiconductor die 200 during manufacture of the semiconductor package. Examples of films for improving warpage such as, for example, the film 202, will be described in detail later in this disclosure, with reference to FIG. 3, in terms of suitable kinds of films and the corresponding improvements in warpage of a semiconductor die.

Figure 2B:
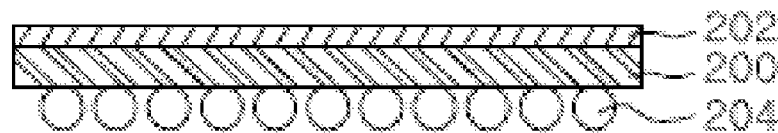

FIG. 2B illustrates an exemplary next step in the manufacture of a semiconductor die package, in accordance with the present disclosure. The illustration of FIG. 2B includes a semiconductor die 200, which may correspond to the semiconductor die 200 of FIG. 2A; a film 202, which may correspond to the film 202 of FIG. 2A; and a plurality of electrically conductive bumps 204. In the illustration of FIG. 2B, the semiconductor die 200 has been prepared for bonding onto a substrate such as, for example, the substrate 206 of FIG. 2D, by the application of the film 202, and by the formation of the plurality of electrically conductive bumps 204 on the semiconductor die 200, to enable electrical interconnection of the semiconductor die 200 with a suitable substrate. The plurality of electrically conductive bumps 204 of FIG. 2B may be formed of a material such as, by way of example and not limitation, a solder material.

Figure 2C:
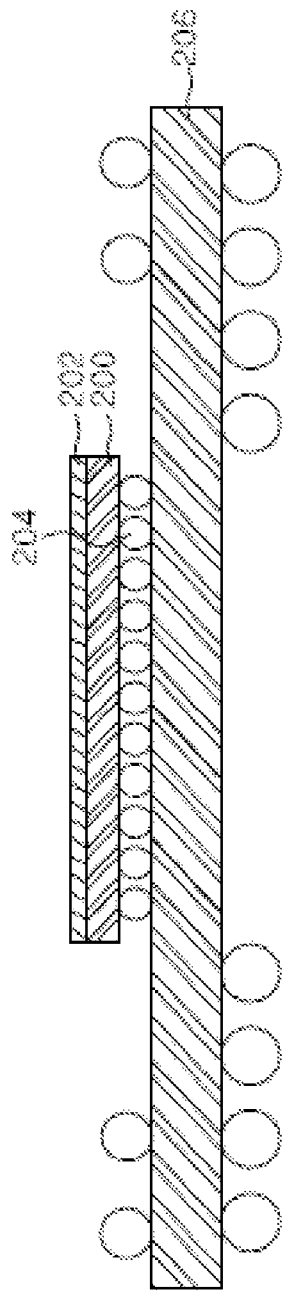

FIG. 2C illustrates a further exemplary step in the manufacture of a semiconductor die package, in accordance with the present disclosure. As shown in example of FIG. 2C, the semiconductor die 200 with film 202 is bonded onto the substrate 206 using the plurality of electrically conductive bumps 204 formed on the face of semiconductor die 200 opposite the film 202, creating locations at which the semiconductor chip die 200 may interconnect with the substrate 206. As noted above, the substrate 206 may be, by way of example and not limitation, a semiconductor or PCB substrate material.

Figure 2D:
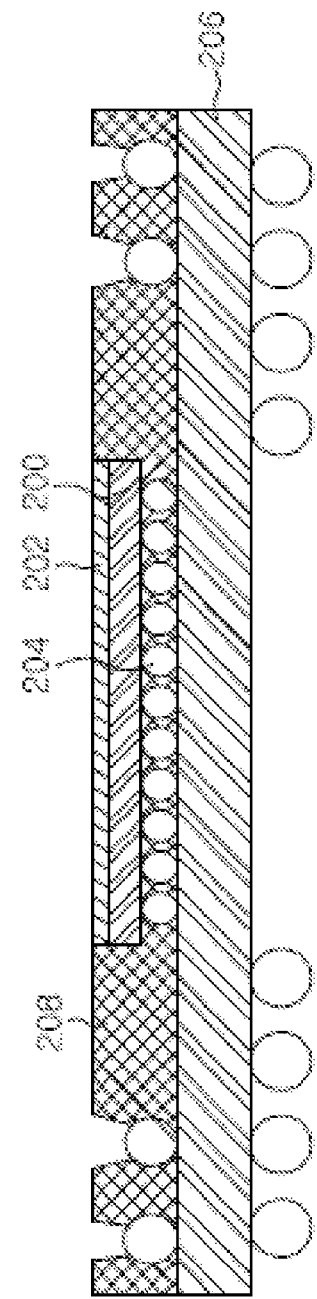

FIG. 2D illustrates another exemplary step in the manufacture of a semiconductor die package, in accordance with the present disclosure. FIG. 2D includes a semiconductor die 200 that may corresponding to, for example, the semiconductor die 200 of FIGS. 2A-C, a plurality of electrically conductive bumps 204 that may correspond to, for example, the plurality of electrically conductive bumps 204 of FIGS. 2B-2C, a substrate 206 that may correspond to, for example, the substrate 206 of FIG. 2C, and a mold compound 208. As shown in the exemplary illustration of FIG. 2D, the mold compound 208 has been applied to fill the region surrounding the edges of the semiconductor die 200 and the space between the substrate 206 and the semiconductor die 200. As shown in the illustrative example of FIG. 2D, the resulting upper surface of the mold compound 208 may be co-planar with the exposed surface of the film 202, and may surround the edges of the film 202. The application of the mold compound 208 to the substrate 206, the semiconductor die 202, and the plurality of bumps 204 may use a molding process and a curing process to complete the production of the semiconductor die package.

Figure 3:
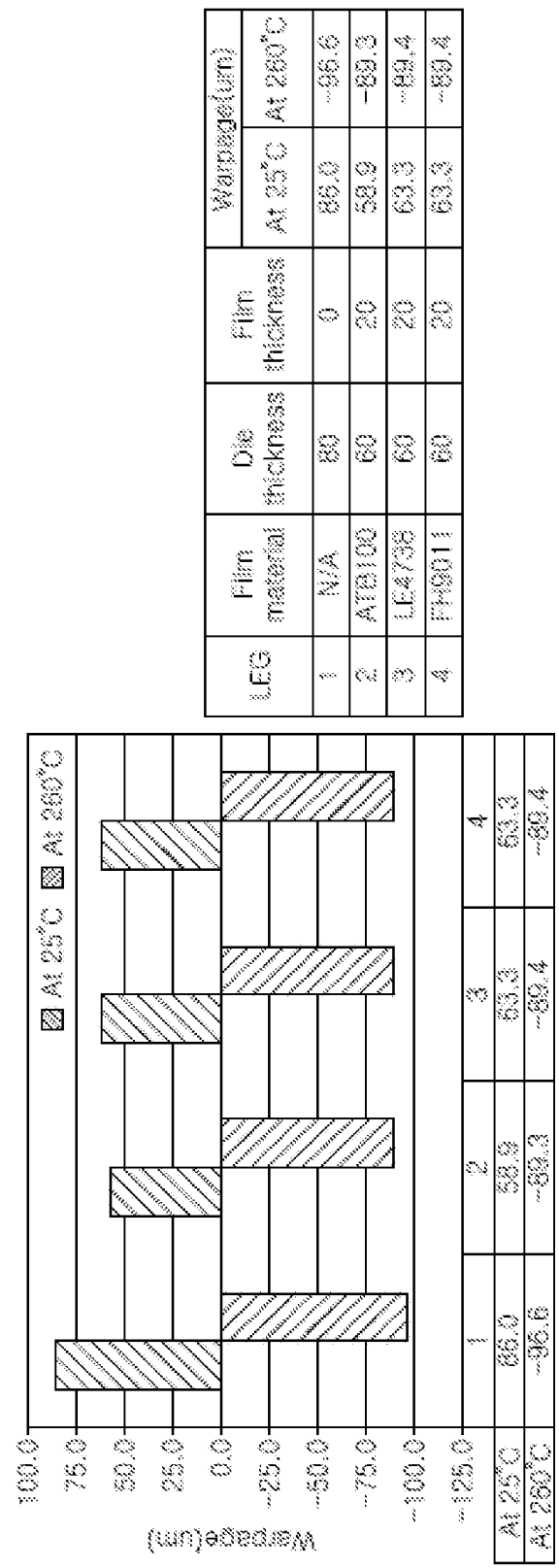
FIG. 3 is a table of experimental data and a corresponding bar graph illustrating kinds of films that may be used in improving semiconductor die warpage and the effectiveness of each type of film in producing improvement of warpage of the semiconductor die, in accordance with an embodiment of the present disclosure.

FIG. 3 is a table illustrating experimental data and a corresponding bar graph illustrating kinds of films that may be used in improving semiconductor die warpage and the effectiveness of each type of film in producing improvement of warpage of the semiconductor die, in accordance with an embodiment of the present disclosure.

Referring now to the chart bars and corresponding table entry labeled "LEG 1" of FIG. 3, for which the film 202 for improving die warpage, illustrated in FIGS. 2A-2D, has not been bonded onto a face of the semiconductor chip die 200, it can be seen that at a temperature of 25° C., warpage due to thermal expansion in a reference semiconductor die geometry was found to be 86.0 µm, while at a temperature of 260° C., warpage of the reference semiconductor die geometry due to thermal expansion was found to be −96.6 µm.

In the remaining three cases "LEG 2," "LEG 3," and "LEG 4" illustrated in FIG. 3, it can clearly be seen that, although the amount of the improvement in warpage of the semiconductor die varies with the kind of film that is bonded to the semiconductor die 200, the bonding of the film 202 of the present disclosure to the semiconductor die 200 provides a lower degree of warpage in the semiconductor die 200 when compared to warpage of a semiconductor die 200 to which a film has not been bonded in a manner in accordance with the present disclosure.

For example, as can be seen in the chart bars and corresponding table entry for "LEG 2" of FIG. 3, in which a film such as the ATB-100 single-layer adhesive film is used as film 202, which may be available from, for example, Henkel AG & Company, it can be seen that at a temperature of 25° C., warpage in the reference semiconductor die geometry of 58.9 µm occurred due to thermal expansion, and at a temperature of 260° C., warpage in the reference semiconductor die geometry of −86.3 µm occurred, demonstrating a considerable improvement in the phenomenon of warpage of a semiconductor die to which is bonded a film in a manner according to the present disclosure, as compared to a reference semiconductor die geometry to which a film has not been bonded.

In a further example, as can be seen in the chart bars and corresponding table entry for "LEG 3" of FIG. 3, in which a film such as LE4738, which may be available from, for example, Lintec Corporation, is used, or the chart bars and corresponding table entry for "LEG 4" of FIG. 3, in which a film such as FH9011, which may be available from Hitachi Chemical Co., Ltd., is used, it can be seen that at a temperature of 25° C., warpage in the reference semiconductor die geometry of 63.3 um occurs due to the thermal expansion, and at a temperature of 260° C., warpage in the reference semiconductor die geometry of −89.4 µm occurs, demonstrating a considerable improvement of the phenomenon of warpage of a reference semiconductor die geometry to which a suitable film is bonded in a manner according to the present disclosure, as compared to a reference semiconductor die geometry to which a film has not been bonded.

As described above, in the manufacturing a package of semiconductor chip die in accordance with the present disclosure, after a film for improving warpage is bonded on one side of the semiconductor chip die, the semiconductor chip die with the film bonded thereon is connected to a substrate for performing a packaging in order to complete the package, and upon being subject to a thermal expansion, a coefficient of thermal expansion of the semiconductor chip die becomes capable of being adjusted by means of the film for improving warpage, thereby improving a phenomenon of warpage of the semiconductor chip die due to the thermal expansion.

While the description of the present disclosure has been made with respect to the exemplary embodiments, various changes and modifications may be made without departing from the scope of the disclosure. Therefore, the scope of the present invention should be defined by the appended claims rather than by the foregoing embodiments.

In view of the above, the present disclosure provides a semiconductor die package structure for improving die warpage and a manufacturing method thereof. In accordance with the present disclosure, the manufacture of a package of a semiconductor die may, after a film for improving die warpage is bonded onto one face of the semiconductor die, bond the semiconductor die with the film to a substrate, and may perform further packaging in order to complete the package. In such a semiconductor die package structure, thermal expansion due to a difference in a coefficient of thermal expansion of the semiconductor die may be adjusted by means of the film, thereby improving warpage of the semiconductor chip die due to the thermal expansion.

In accordance with an aspect of the present disclosure, there is provided a semiconductor die package structure that may include, for example, a semiconductor die; a film for improving die warpage bonded on one face of the semiconductor die; a substrate onto which the semiconductor die is bonded; and a plurality of bumps formed on another face of the semiconductor die for electrically interconnecting the semiconductor die and the substrate. The film for improving die warpage may be one of ATB100 or FH9011, and the film for improving die warpage may be bonded on a back side of the semiconductor die. Further, the film for improving die warpage may be formed with a thickness in a range of 10 µm to 100 µm.

In accordance with another aspect of the present disclosure, there is provided a method of bonding a semiconductor die for improving die warpage, in which the method includes bonding a film for improving die warpage onto one face of the semiconductor die; forming a plurality of electrically conductive bumps on another face of the semiconductor die, and bonding the semiconductor die onto the substrate using the plurality of bumps. Further, the film for improving die warpage may be one of ATB100 or FH9011, and the film for improving die warpage may be bonded on the back side of the semiconductor die. Further, the film for improving die warpage may be formed with a thickness in a range of 10 µm to 100 µm.

Aspects of the present disclosure may be seen in a semiconductor die package comprising a semiconductor die having a first face and a second face opposite the first face; a film for improving warpage of the semiconductor die, the film having a first surface and a second surface opposite the first surface, the first surface of the film bonded to and covering the first face of the semiconductor die; and a plurality of electrically conductive bumps formed on the second face of the semiconductor die. The semiconductor die package may also comprise a substrate onto which the semiconductor die is bonded using the plurality of electrically conductive bumps that electrically interconnect the semiconductor die and the substrate; and a mold compound surrounding edges of the film and edges of the semiconductor die, and covering the substrate.

In a representative embodiment of the present disclosure, the film for improving die warpage may be a single-layer, self-adhesive film. The second face of the semiconductor die may comprise one or more circuit elements electrically connected to the plurality of electrically conductive bumps, and the film for improving die warpage may have a thickness in a range of 10 µm to 100 µm. The plurality of electrically conductive bumps may comprise a solder, an exposed surface of the mold compound may be coplanar with the second surface of the film, and the substrate may comprise a printed circuit board (PCB) material.

Further aspects of the present disclosure may be found in a method of manufacturing a semiconductor die package exhibiting improved die warpage. Such a method may comprise providing a semiconductor die having a first face and a second face opposite the first face; bonding a film for improving die warpage onto the first face of the semiconductor die; and forming a plurality of electrically conductive bumps on the second face of the semiconductor die. In addition, the method may comprise bonding the semiconductor die onto a substrate using the plurality of the electrically conductive bumps to electrically interconnect the semiconductor die and the substrate; and applying a mold compound to surround edges of the film and edges of the semiconductor die, and to cover the substrate. The film for improving die warpage may be a single-layer, self-adhesive film, and the second face of the semiconductor die may comprise one or more circuit elements electrically connected to the plurality of electrically conductive bumps. The film for improving die warpage may have a thickness in a range of 10 µm to 100 µm, the plurality of electrically conductive bumps may comprise a solder, an exposed first surface of the mold compound may be coplanar with the first surface of the film, and the substrate may comprise a printed circuit board (PCB) material.

Yet additional aspects of the present disclosure may be observed in a method or producing a semiconductor die package exhibiting improved die warpage and having a certain package thickness. Such a method may comprise providing a semiconductor die having a first face and a second face opposite the first face, the first face and the second face defining a thickness of the semiconductor die; and forming a plurality of electrically conductive bumps on the second face of the semiconductor die. The method may comprise bonding the semiconductor die onto a substrate using the plurality of the electrically conductive bumps to electrically interconnect the semiconductor die and the substrate. The method may also comprise determining a thickness of a film for bonding to and improving warpage of the semiconductor die, the film having a first surface and a second surface opposite the first surface, the first surface and the second surface defining a thickness of the film, and wherein the thickness of the film is adjusted based upon the certain package thickness and the thickness of the semiconductor die. The method may further comprise bonding a first surface of the film to the first face of the semiconductor die; and applying a mold compound to surround edges of the film and edges of the semiconductor die and to cover the substrate, to form a surface of the mold compound that is co-planar with the second surface of the film, to produce the semiconductor die package of the certain package thickness.

In a representative embodiment in accordance with the present disclosure, the film for improving die warpage may be a single-layer, self-adhesive film. The second face of the semiconductor die may comprise one or more circuit elements electrically connected to the plurality of electrically conductive bumps, and the film for improving die warpage may have a thickness in a range of 10 µm to 100 µm. The plurality of electrically conductive bumps may comprise a solder, and an exposed first surface of the mold compound may be coplanar with the first surface of the film.

The configuration of an embodiment of the present disclosure provides an advantage of improving a phenomenon of die warpage of a semiconductor die due to thermal expansion by manufacturing a package of a semiconductor die in which, after a film for improving die warpage is bonded onto one face of the semiconductor die, the semiconductor die with the film bonded thereon is then connected to a substrate, and further packaging is performed in order to complete the package. Upon being subject to a thermal expansion, a coefficient of thermal expansion of the semiconductor die may be adjusted by means of the film for improving die warpage.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A semiconductor die package comprising:
   a semiconductor die having a first face, a second face opposite the first face, and a die edge face joining the first face to the second face;
   a film that reduces warpage of the semiconductor die, the film having a first surface, a second surface opposite the first surface, and a film edge surface joining the first surface to the second surface, the first surface of the film bonded to and covering the first face of the semiconductor die, and wherein the film is a single-layer, self-adhesive film;
   a plurality of electrically conductive bumps formed on the second face of the semiconductor die;
   a substrate having a top surface onto which the semiconductor die is bonded using the plurality of electrically conductive bumps that electrically interconnect the semiconductor die and the substrate;

one or more interconnects on the top surface of the substrate; and a mold compound covering the substrate and directly contacting the film edge surface and the die edge face, wherein a top surface of the mold compound is coplanar with the second surface of the film, and wherein the mold compound encompasses the one or more interconnects such that a top surface of the one or more interconnects does not extend beyond the top surface of the mold compound.

2. The semiconductor die package according to claim 1, wherein the film has a thickness in a range of 10 µm to 100 µm.

3. A semiconductor die package comprising:
a substrate having a first surface;
a semiconductor die having a first face, a second face opposite the first face, and a die edge face joining the first face to the second face;
a plurality of conductive elements bonding and electrically interconnecting the second face of the semiconductor die to the first surface of the substrate;
a film that reduces warpage of the semiconductor die, the film having a first surface, a second surface opposite the first surface, and a film edge surface joining the first surface to the second surface, the first surface of the film bonded to and covering the first face of the semiconductor die, and wherein the film is a single-layer, self-adhesive film;
one or more interconnects on the first surface of the substrate; and
a mold compound directly contacting the film edge surface and the die edge face, and filling a region between the first surface of the substrate and the second surface of the semiconductor die, wherein a top surface of the mold compound is coplanar with the second surface of the film, and wherein the mold compound encompasses the one or more interconnects such that a top surface of the one or more interconnects does not extend beyond the top surface of the mold compound.

4. The semiconductor die package according to claim 3, wherein the film has a thickness in a range of 10 µm to 100 µm.

5. The semiconductor die package according to claim 3, wherein the second face of the semiconductor die comprises one or more circuit elements electrically connected to the plurality of conductive elements.

6. A semiconductor die package comprising:
a semiconductor die having a first face, a second face opposite the first face, and a die edge face joining the first face to the second face;
a film that reduces warpage of the semiconductor die, the film having a first surface covering the first face of the semiconductor die, a second surface opposite the first surface, and a film edge surface joining the first surface to the second surface, wherein the film is a single-layer, self-adhesive film;
a plurality of conductive elements attached to and extending outward from the second face of the semiconductor die;
a substrate having a top surface onto which the semiconductor die is bonded using the plurality of conductive elements that electrically interconnect circuitry of the semiconductor die and the substrate;
one or more interconnects on the top surface of the substrate; and
a mold compound directly contacting and covering the film edge surface and the plurality of conductive elements, and exposing the second surface of the film opposite the first surface of the film, wherein a top surface of the mold compound is coplanar with the second surface of the film, and wherein the mold compound encompasses the one or more interconnects such that a top surface of the one or more interconnects does not extend beyond the top surface of the mold compound.

7. The semiconductor die package according to claim 6, wherein the second face of the semiconductor die comprises one or more circuit elements electrically connected to the plurality of conductive elements.

8. The semiconductor die package according to claim 6, wherein the film has a thickness in a range of 10 µm to 100 µm.

9. The semiconductor die package according to claim 1, wherein the mold compound directly covers the film edge surface and the die edge face, and wherein the second surface of the film is exposed by the mold compound.

10. The semiconductor die package according to claim 3, wherein the mold compound directly covers the film edge surface, the die edge face, and the substrate, and wherein the second surface of the film is exposed by the mold compound.

11. The semiconductor package according to claim 1, wherein:
the second surface of the film consists of a single planar surface; and
the top surface of the mold compound is coplanar with the single planar surface of the second surface.

12. The semiconductor package according to claim 1, wherein:
the second surface of the film and the top surface of the mold compound define an upper, external surface of the semiconductor package; and a lower surface of the substrate defines a lower, external surface of the semiconductor package that is opposite the upper, external surface.

13. The semiconductor package according to claim 3, wherein:
the second surface of the film consists of a single planar surface; and the top surface of the mold compound is coplanar with the single planar surface of the second surface.

14. The semiconductor package according to claim 3, wherein:
the second surface of the film and the top surface of the mold compound define an upper, external surface of the semiconductor package; and a second surface of the substrate, opposite the first surface of the substrate, defines a lower, external surface of the semiconductor package.

15. The semiconductor package according to claim 6, wherein:
the second surface of the film consists of a single planar surface; and the top surface of the mold compound is coplanar with the single planar surface of the second surface.

16. The semiconductor package according to claim 6, wherein:
the second surface of the film and the top surface of the mold compound define an upper, external surface of the semiconductor package; and a lower surface of the substrate defines a lower, external surface of the semiconductor package that is opposite the upper, external surface.

* * * * *